(12) United States Patent
Hofmann et al.

(10) Patent No.: US 6,673,677 B2
(45) Date of Patent: Jan. 6, 2004

(54) METHOD FOR MANUFACTURING A MULTI-BIT MEMORY CELL

(75) Inventors: Franz Hofmann, München (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/352,826

(22) Filed: Jan. 28, 2003

(65) Prior Publication Data

US 2003/0134475 A1 Jul. 17, 2003

Related U.S. Application Data

(63) Continuation of application No. PCT/DE01/02811, filed on Jul. 25, 2001.

(30) Foreign Application Priority Data

Jul. 28, 2000 (DE) .......................................... 100 36 911

(51) Int. Cl.⁷ ............................................. H01L 21/336
(52) U.S. Cl. .................................................... 438/257
(58) Field of Search ................................ 438/257, 259, 438/267

(56) References Cited

U.S. PATENT DOCUMENTS

| 5,408,115 | A |  | 4/1995 | Chang ........................ 257/324 |
| 5,768,192 | A |  | 6/1998 | Eitan ..................... 365/185.24 |
| 5,796,140 | A |  | 8/1998 | Tomioka ..................... 257/316 |
| 5,877,523 | A |  | 3/1999 | Liang et al. ................. 257/315 |
| 5,969,383 | A |  | 10/1999 | Chang et al. ............... 257/316 |
| 6,574,143 | B2 | * | 6/2003 | Nakazato ............... 365/185.18 |

FOREIGN PATENT DOCUMENTS

| JP | 2000058680 A | 2/2000 |
| WO | WO 99/49518 | 9/1999 |

\* cited by examiner

*Primary Examiner*—Hoai Ho
*Assistant Examiner*—Quoc Hoang
(74) *Attorney, Agent, or Firm*—Laurence A. Greenberg; Werner H. Stemer; Ralph E. Locher

(57) ABSTRACT

A memory layer intended for trapping charge carriers over a source region and a drain region is interrupted over the channel so that a diffusion of the charge carriers, which are trapped over the source region and over the drain region, is prevented. The memory layer is limited to regions over the parts of the source region and of the drain region facing the channel and is embedded all around in oxide.

3 Claims, 4 Drawing Sheets

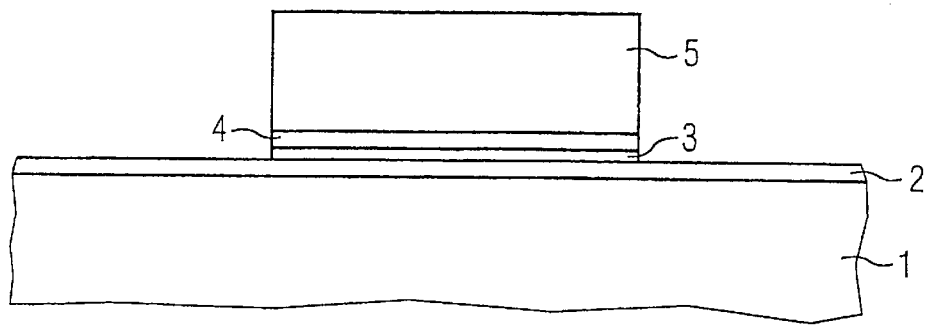
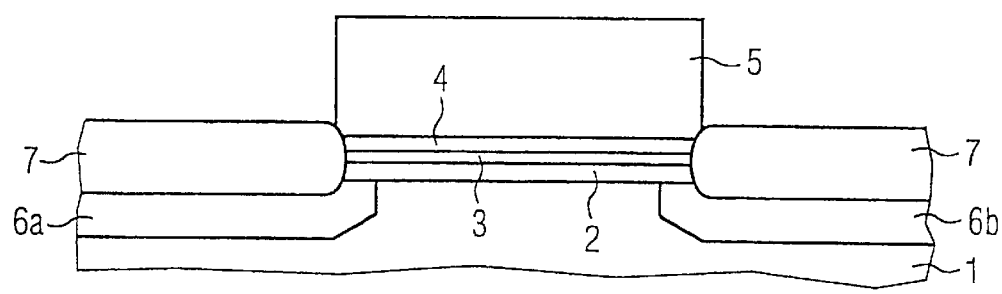
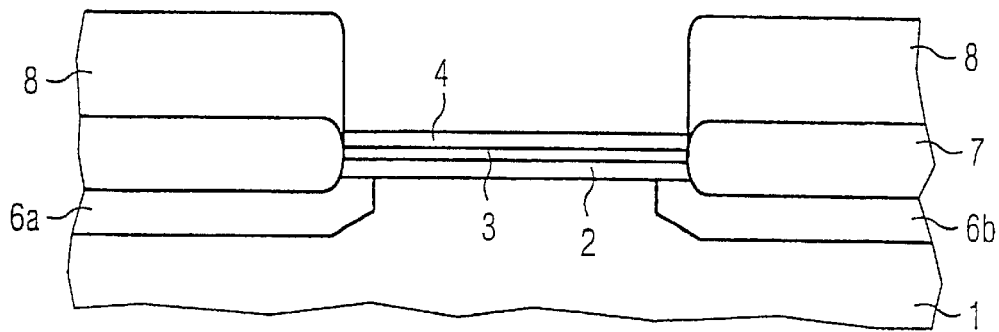

METHOD FOR MANUFACTURING A MULTI-BIT MEMORY CELL

CROSS-REFERENCE TO RELATED APPLICATION

This application is a continuation of copending International Application No. PCT/DE01/02811, filed Jul. 25, 2001, which designated the United States and was not published in English.

BACKGROUND OF THE INVENTION

Field of the Invention

The present invention relates to a manufacturing method for a multi-bit memory cell with self-adjusting ONO regions.

In U.S. Pat. No. 5,768,192, a non-volatile memory is described in which electrons are trapped at a source region or a drain region respectively in a memory layer. The trapped electrons determine a threshold voltage of the transistor, which is configured as a semiconductor oxide nitride oxide semiconductor (SONOS) transistor. The presence of a charge at the source or drain respectively can be interpreted as a stored bit so that two bits can be stored in a cell of this kind. For programming, hot charge carriers are produced in the channel; the electrons are injected near to the drain region from the semiconductor material into the memory layer. In addition, a potential difference of typically 5 V is applied to a word line running via the gate in the direction from the source to the drain. The source region itself is connected to 0 V and the drain region, as a bit line, to 5 V. By reversing the applied voltage, charges can also be trapped in the source region. A potential difference of typically 1.2 V between the source and drain and a gate voltage between the threshold voltage in the unprogrammed state and the threshold voltage in the programmed state enable the bit stored on the source side to be read. A clearly negative potential on the gate and e.g. 5 V on the drain (word line almost current-less) allow erasure by forcing the trapped charge carriers back into the source or drain region, which is positive with respect to ground (GIDL, gate-induced drain leakage).

These days, in a highly integrated memory, the distance from the source to the drain is only 150 nm. If the memory chips are stored in unfavorable conditions (particularly at high temperatures, typically 85° C., which can be reached in an automobile for example), the number of charge/discharge cycles that can be carried out without any problem (endurance) can be reduced if the trapped charge carriers no longer remain sufficiently localized in the dielectric nitride. It is then more difficult to read out separately the stored bits at source and drain.

In U.S. Pat. No. 5,877,523, a multilevel split gate flash memory cell is described in which an oxide layer and a polysilicon layer intended as a memory layer are applied and structured to form floating gate electrodes in two parts. The remaining parts are coated with a dielectric layer. Onto this is applied a conducting layer, which is structured to form a gate electrode. This is supplemented by implantations of a doping material to form the source and the drain.

In U.S. Pat. No. 5,969,383, a split gate memory device is described in which a series of layers of silicon dioxide, silicon nitride and silicon dioxide is provided over part of the channel region and over part of the drain region in each case, of which the series of layers over the channel is provided with a control gate electrode. The programming of the memory cell takes place at this point by trapping charge carriers in the silicon nitride layer. A selection gate electrode is disposed over a remaining part of the channel region.

In U.S. Pat. No. 5,796,140, a method for manufacturing a memory cell is described in which the source and the drain are formed as doped regions, separated from one another by a channel region. A memory layer intended for storing charge carriers is provided over these regions between the boundary layers and embedded therein, a gate electrode is applied, separated from the semiconductor material by a dielectric layer, whereby the memory layer, with the exception of regions which are located at the boundaries between the channel region and the source or drain region respectively, is removed.

In published, Japanese Patent Application JP 2000–58680, a semiconductor memory device is specified in which an oxide-nitride-oxide layer is also applied to the edges of the gate electrode.

SUMMARY OF THE INVENTION

It is accordingly an object of the invention to provide a method for manufacturing a multi-bit memory cell that overcomes the above-mentioned disadvantages of the prior art methods of this general type, which guarantees a larger number of charge and discharge cycles even under unfavorable conditions.

With the foregoing and other objects in view there is provided, in accordance with the invention, a method for manufacturing a memory cell circuit. The method includes providing a body being either a semiconductor body or a layer of semiconductor material, and providing a series of layers on the body. The series of layers include a first oxide layer, a memory layer disposed above the first oxide layer and intended for storing charge carriers, and a second oxide layer disposed above the memory layer. The memory layer outside a region intended for a memory cell is removed. An implantation of a doping material in the body is carried out for forming a source region and a drain region separated by a channel region and disposed below the series of layers. An auxiliary layer is provided outside the region occupied by the memory layer. The auxiliary layer has a recess in the region of the memory layer with sufficiently steep edges. Spacers are formed in the recess at the edges of the auxiliary layer. A part of the memory layer disposed between the spacers is removed. A dielectric layer is formed between the spacers. A gate electrode is formed on the dielectric layer and the dielectric layer and the gate electrode are structured. A conductor track is applied, the conductor track is electrically conductively connected to the gate electrode.

In the multi-bit memory cell manufactured according to the invention, the memory layer intended for trapping charge carriers at the source and the drain is limited to the edge region of the source region or drain region bordering the channel region. The memory layer is disposed between the boundary layers and embedded in a material with a higher energy band gap so that the charge carriers, which are trapped in the memory layer over the source region and over the drain region respectively, remain localized there.

A nitride is preferably considered for the material for the memory layer; an oxide is primarily suitable for the surrounding material. In the case of a memory cell in the silicon material system, the memory cell in this example is silicon nitride with an energy band gap of about 5 eV, the surrounding boundary layers are silicon oxide with an energy band gap of about 9 eV. The memory layer can be a different material with a smaller energy band gap than that of the boundary layers, whereby, for a good electrical confinement of the charge carriers, the difference in the energy band gaps should be as large as possible. Therefore, tantalum oxide, hafnium silicate or intrinsically conducting (undoped) silicon, for example, can be used in conjunction with silicon oxide as the material for the memory layer. Silicon nitride has a relative dielectric constant of about 7.9. The use of an alternative material with a higher dielectric constant (e.g.= 15 ... 18) permits a reduction in the overall thickness of the stack of layers provided for storage and is thus an advantage.

In the method, the memory layer provided for trapping the charge carriers is completely removed outside a region over that boundary of the source region and the drain region that, in each case, faces the channel region. After this, the gate oxide and the gate electrode or a conducting track intended as a word line are manufactured and structured and edges of the memory layer that are still free are embedded in the material of the boundary layers, preferably an oxide. By removing the memory layer over the channel region, the SONOS transistor cell manufactured in this way has memory regions over source and drain that are separated from one another.

In a particularly preferred exemplary embodiment, the gate oxide is not only manufactured on the semiconductor material of the channel region in the substrate but also in the vertical direction on the edges of the gate electrode so that, by this process, an additional electrical insulation of the adjacent memory layers is effected. The manufacture of a vertical oxide layer on the edges of the gate electrode also changes the distribution of the electrical field so that the hot electrons are accelerated more strongly in the direction of the memory layer and are trapped there. The operational characteristics (performance) of the memory cell, in particular when programming, are significantly improved by this process.

Other features which are considered as characteristic for the invention are set forth in the appended claims.

Although the invention is illustrated and described herein as embodied in a method for manufacturing a multi-bit memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–10 are diagrammatic, cross-sectional views showing various steps in the manufacture of a memory cell according to the invention.

DESCRIPTION OF THE PREFERRED EMBODIMENTS

Figure 4:
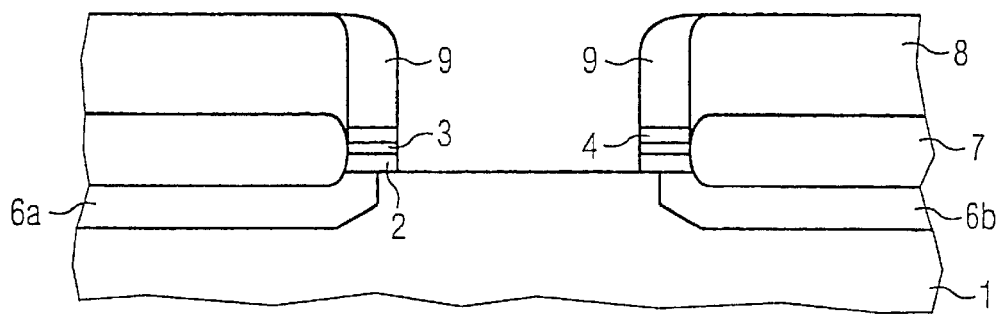

There follows a more detailed description of examples of the memory cell according to the invention with reference to particularly suitable manufacturing methods, the intermediate products of which are shown in cross section in FIGS. 1 to 6 and 7 to 10 respectively. A configuration containing a large number of individual memory cells of this type can be manufactured on one chip.

Referring now to the figures of the drawing in detail and first, particularly, to FIG. 1 thereof, there is shown in cross-section a semiconductor body 1 or a layer or layer structure of semiconductor material grown on a substrate. If the semiconductor material does not have the desired basic doping, so-called wells (e.g. p-wells) of a specified conductivity are manufactured by implanting doping material in the required concentration in a manner known per se. FIG. 1 shows a lower oxide layer 2 (bottom oxide) applied to the semiconductor body 1 as a lower boundary layer. On top of the oxide layer 2, is a memory layer 3 intended for trapping charge carriers (here, in this example, silicon nitride). On top of the memory layer 3, is a further oxide layer 4 (top oxide) as an upper boundary layer and, as a topmost layer, an auxiliary layer 5, which is considerably thicker than the previous layers and is preferably also a nitride. By a first photographic technique, using a mask, e.g. made of photoresist, the memory layer 3, the upper oxide layer 4 and the auxiliary layer 5 are structured in the manner shown in FIG. 1 so that they are restricted laterally to the region intended for the memory cell. The mask has already been removed in the illustration in FIG. 1.

The auxiliary layer 5 is then used as a mask in order to manufacture source 6a and drain 6b regions by an implantation of doping material in the semiconductor material. When using a p-doped substrate made of silicon as the semiconductor body 1, arsenic, for example, is a suitable doping material for this purpose. Furthermore, according to FIG. 2, lateral oxide layers 7 are also manufactured. This is carried out most easily by oxidizing the silicon of the substrate. In doing so, the material experiences an increase in volume so that the surface of the lateral oxide layer 7 is over the memory layer 3.

Then, if required, a further auxiliary layer 8, which, for example, can also be an oxide, can be deposited to the side of to the first auxiliary layer 5. A flat surface of the further auxiliary layer 8 can, for example, be manufactured by chemical mechanical polishing (CMP), the whole surface being planarized. The first auxiliary layer 5 is then removed, this preferably is carried out by a wet chemical process, the upper oxide layer 4 serving as an etch stop layer. In this way, the structure of the intermediate product shown in FIG. 3 is obtained.

Spacers 9 shown in FIG. 4 are then made in a manner that is known per se. For this purpose, a layer of the material, intended for the spacers 9, with a largely uniform thickness is preferably deposited over the whole surface and subsequently anisotropically etched back so that the spacers 9 shown remain on the inner edges of the auxiliary layer 8. As the spacers 9 can be used as part of a gate electrode, which can be made later, it is recommended that polysilicon doped in situ be deposited as a material for the spacers 9. The spacers 9 are then used to etch away the upper oxide layer 4, the memory layer 3 and the lower oxide layer 2 in the region between the spacers 9 and to retain these in the region under the spacers 9. The memory layer 3 is thus already limited to regions at the edges of the source and the drain, which face the gate.

Figure 5:
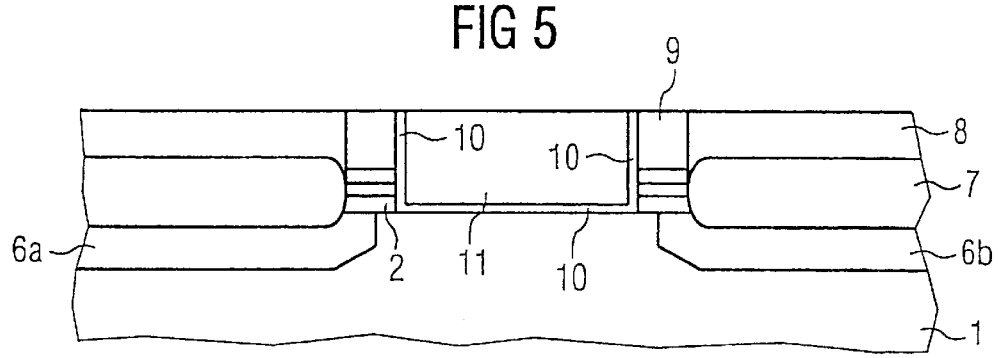

A dielectric layer 10 shown in FIG. 5 is formed on the semiconductor material of the substrate 1 and on the lateral inner edges formed by the spacers 9. This is carried out most easily by a surface oxidation of the semiconductor material 1, in particular when using silicon. A gate electrode 11 is then formed or completed by depositing the material intended for this purpose in the recess between the spacers 9. Preferably, polysilicon doped in situ is likewise used for this purpose. A further CMP step serves to planarize the surface according to the representation of FIG. 5.

Figure 6:
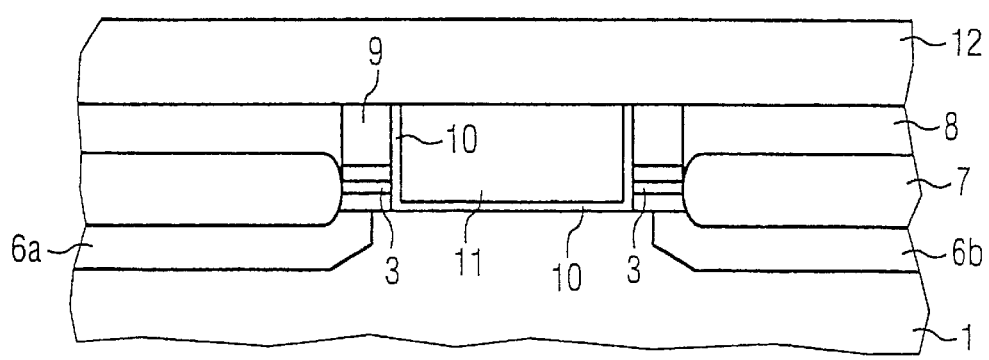
Figure 7:
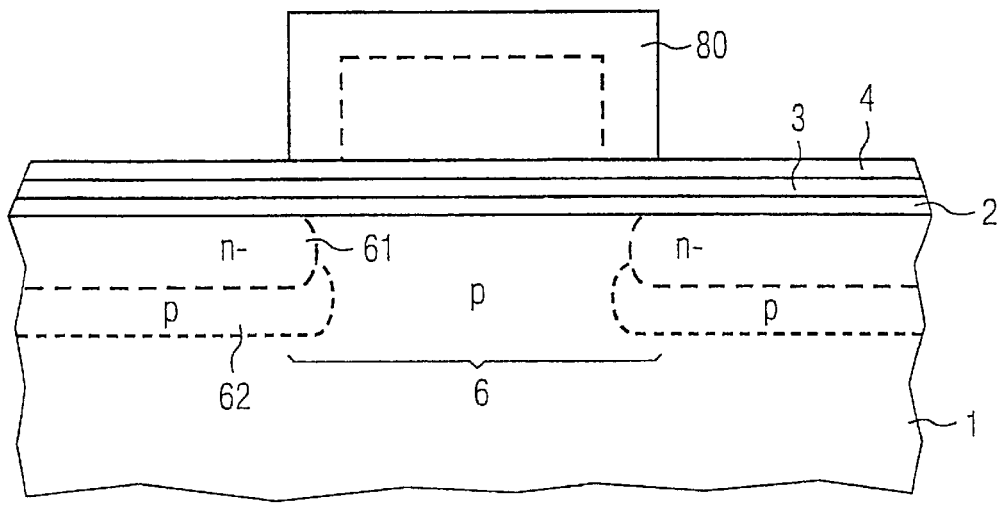

The cross section of the memory cell for the state after depositing a conductor track as a connecting feed 12 for the gate electrode, which, for example, is provided as a word line for a memory cell configuration, is shown in FIG. 6. The conductor track 12 is likewise preferably doped polysilicon.

The structuring of the cell is then completed by limiting the structure shown in FIG. 6 in the directions perpendicular to the plane of the drawing. This takes place by a further photographic technique, with which the material at the side of the gate electrode is etched away down to the upper oxide layer 4. Subsequently, the memory layer 3 is etched away preferably by a wet chemical process. A further oxidation serves to embed the now free edges of the memory layer 3 in oxide. The memory layer 3 is therefore also bounded by oxide layers in both directions perpendicular to the plane of the drawing of FIG. 6 as a result of the method according to the invention. All edges of the memory layer 3 are therefore embedded in oxide so that the charge carriers trapped in the two parts of the memory layer 3 are permanently prevented from flowing together. Therefore, with this method, small multi-bit memory cells can be manufactured, which have a considerably longer life than previous memory cells of this kind.

An alternative method, which provides a memory cell according to the invention with a slightly modified structure, is shown in FIGS. 7 to 10. This method likewise starts with the semiconductor body 1 (FIG. 7) or a layer or layer structure of semiconductor material grown on a substrate. In order that the semiconductor material has the desired basic doping, if necessary, a p-well or an n-well is manufactured by the implantation of doping material in the required concentration. On top of this, the lower oxide layer 2 (bottom oxide) as a lower boundary layer, the memory layer 3 intended for trapping charge carriers and the further oxide layer 4 (top oxide) as an upper boundary layer are applied over the whole surface.

An auxiliary layer 80, which, for example, can be polysilicon, is structured according to the contours shown to form a remaining part over a channel region 6 to be manufactured. Using the auxiliary layer 80, an implantation of doping material is preferably first carried out in order to manufacture lightly doped drain (LDD) regions 61 at those edges of the source region and the drain region that face the channel region 6. By this process, doped regions are manufactured with poor electrical conductivity of the sign opposite to the basic doping. The implantation is thus carried out in the case of a p-well for n-doping. In a manner, which is known per se, an additional so-called pocket implantation 62 for the conductivity type of the basic doping (in the example p) is preferably carried out, but with a somewhat higher doping material concentration in order to obtain a sharper limitation of the source region or drain region. If the auxiliary layer 80 serves as a mask for the implantations, it is subsequently isotropically re-etched to the dimensions shown dotted in FIG. 7. As, in doing so, some of the layer thickness is lost, an appropriate reserve must be calculated into the original layer thickness in order to obtain the correct residual layer thickness. If the LDD and the pocket implantations are dispensed with, the auxiliary layer is structured exactly to the dimensions of the contour shown in dotted lines.

Figure 8:
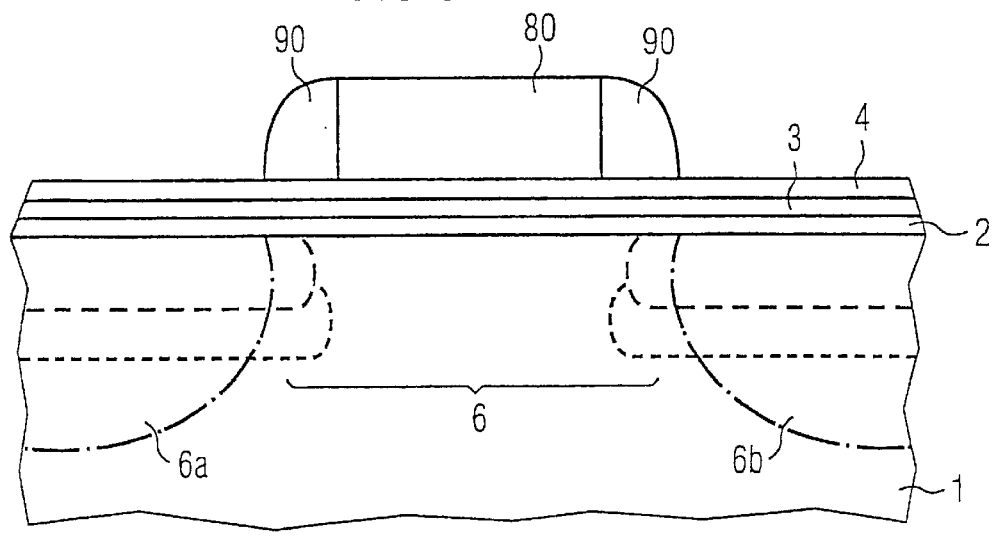

It is shown in FIG. 8 that spacers 90 are manufactured on the mutually opposing edges of the auxiliary layer 80 at the limits of the regions of source and drain to be manufactured. The spacers 90 are made in a manner, which is known per se, by first isotropically applying a layer of the material concerned (e.g. of nitride) over the whole area in a layer thickness intended for the width of the spacers and then anisotropically re-etching the layer until the horizontal parts of the layer have disappeared and only vertical parts of the layer remain, which essentially have the thickness of the original layer. Using the spacers 90, the actual implantations of doping material for the source region 6a and the drain region 6b are then applied. The sign of the conductivity of these dopings is opposite to the sign of the basic doping (in the example $n^+$).

Figure 9:
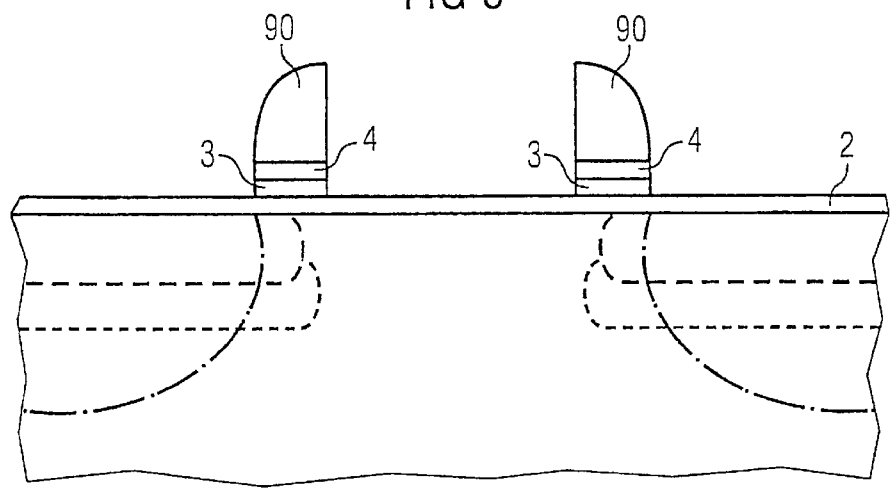

The auxiliary layer 80 is then removed so that only the spacers 90 remain. Using the spacers 90 as a mask, the structure shown in FIG. 9 is manufactured by removing the upper oxide layer 4 and the memory layer 3 outside the regions covered by the spacers 90. After the spacers 90 have been removed, only the remaining parts of the memory layer 3 that are covered with oxide remain on the surface of the lower oxide layer 2. These parts are each situated at the boundary between the channel region 6 and the source region 6a or the drain region 6b respectively, namely, as a result of the method of manufacture, overlapping the source region or drain region respectively and one end of the channel region in each case.

Figure 10:
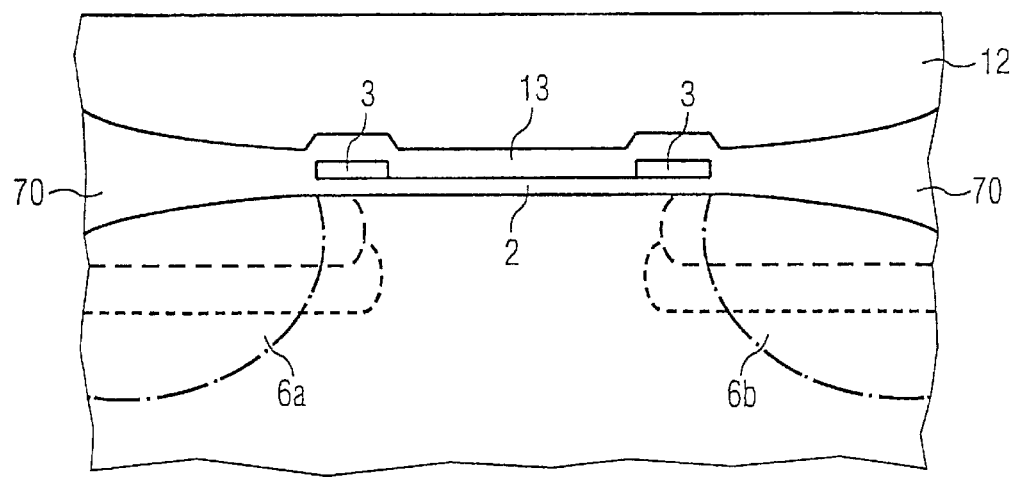

An oxide layer 13 is manufactured, which is formed at least over the channel region 6 and over the memory layer 3 so that the memory layer 3 is completely surrounded by the oxide layer 13. The oxide layer 13 can be manufactured partly by re-oxidation of the nitride (in particular, when using silicon as the semiconductor material: $2\ Si_3N_4 + 12\ H_2O$ produces $6\ SiO_2$), partly by the deposition of oxide (CVD oxide, chemical vapor deposition; in particular, when using silicon as the semiconductor material: thermal oxidation of TEOS, tetraethylorthosilicate, $Si(OC_2H_5)_4 + 12\ O_2$ produces $SiO_2$). A thermal oxidation of silicon additionally has the advantage that the silicon over the parts of the regions of the source and the drain facing away from the channel region can be increasingly oxidized to form thicker oxide layers 70. The structure shown in FIG. 10 is completed by applying the conductor track 12 intended as a word line and a respective gate electrode. The conductor track 12 is structured in the form of a strip running from the source via the channel region to the drain so that the conductor track 12 is limited at the sides by edge surfaces to be conceived in front of and behind the plane of the drawing. The part of the memory layer that is exposed as a result of this is removed. Preferably, the edges of the memory layer exposed as a result of this are subsequently embedded in oxide, which expediently takes place by re-oxidation.

We claim:

1. A method for manufacturing a memory cell circuit, which comprises the steps of:

providing a body selected from the group consisting of a semiconductor body and a layer of semiconductor material forming the body;

providing a series of layers on the body, the series of layers including a first oxide layer, a memory layer above the first oxide layer and intended for storing charge carriers, and a second oxide layer above the memory layer;

removing the memory layer outside a region intended for a memory cell;

carrying out an implantation of a doping material in the body for forming a source region and a drain region separated by a channel region and disposed below the series of layers;

providing an auxiliary layer outside the region occupied by the memory layer, the auxiliary layer having a recess in the region of the memory layer with sufficiently steep edges;

forming spacers in the recess at the edges of the auxiliary layer;

removing part of the memory layer disposed between the spacers;

forming a dielectric layer between the spacers;

forming a gate electrode on the dielectric layer and structuring the dielectric layer and the gate electrode; and applying a conductor track, the conductor track being electrically conductively connected to the gate electrode.

2. The method according to claim 1, which comprises forming the dielectric layer on the body and on sides of the spacers.

3. The method according to claim 1, which comprises embedding free edges of the memory layer in an oxide.

* * * * *